(12) United States Patent
Luo et al.

(10) Patent No.: US 11,418,001 B2
(45) Date of Patent: Aug. 16, 2022

(54) WAVELENGTH-TUNABLE LASER

(71) Applicant: HUAWEI TECHNOLOGIES CO., LTD., Guangdong (CN)

(72) Inventors: Jun Luo, Dongguan (CN); Qian Wang, Dongguan (CN); Romain Brenot, Boulogne-Billancourt (FR)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 70 days.

(21) Appl. No.: 17/126,716

(22) Filed: Dec. 18, 2020

(65) Prior Publication Data
US 2021/0104862 A1    Apr. 8, 2021

Related U.S. Application Data

(63) Continuation of application No. PCT/CN2019/091044, filed on Jun. 13, 2019.

(30) Foreign Application Priority Data

Jun. 20, 2018    (CN) .......................... 201810633315.8

(51) Int. Cl.
*H01S 3/10* (2006.01)
*H01S 5/00* (2006.01)
(Continued)

(52) U.S. Cl.
CPC ........ *H01S 5/0078* (2013.01); *H01S 3/10053* (2013.01); *H01S 5/0608* (2013.01);
(Continued)

(58) Field of Classification Search
CPC .. H01S 5/0078; H01S 5/10053; H01S 5/0608; H01S 5/1042; H01S 5/124; H01S 5/141
See application file for complete search history.

(56) References Cited

U.S. PATENT DOCUMENTS

| | | | |
|---|---|---|---|
| 6,754,243 B2 * | 6/2004 | Missey | G02B 26/0816 372/50.1 |
| 6,816,515 B1 * | 11/2004 | Yun | H01S 3/1112 372/18 |

(Continued)

FOREIGN PATENT DOCUMENTS

| | | |
|---|---|---|
| CN | 1349692 A | 5/2002 |
| CN | 1651950 A | 8/2005 |

(Continued)

OTHER PUBLICATIONS

Li Zhongnian, Communications for Electric Power, Beijing Defense Industry Press, May 31, 2009, 547 pages, With an English abstract.

*Primary Examiner* — Kinam Park
(74) *Attorney, Agent, or Firm* — Womble Bond Dickinson (US) LLP

(57) ABSTRACT

This application describes a wavelength-tunable laser apparatus, which reduces complexity of wavelength tuning of a laser. The laser includes a reflective gain unit, an optical phase shifter, a coupler, and a passive filter unit array. Furthermore, an output port of the reflective gain unit is connected to an input port of the optical phase shifter, an output port of the optical phase shifter is connected to an input port of the coupler, a first output port of the coupler is connected to an input port of the passive filter unit array, and a second output port of the coupler is an output port of the laser. The passive filter unit array includes a plurality of passive filter units, where any two of the plurality of passive filter units have different wavelength tuning ranges, and each filter unit has a linearly tunable wavelength.

18 Claims, 10 Drawing Sheets

(51) Int. Cl.
    *H01S 5/06*           (2006.01)
    *H01S 5/10*           (2021.01)
    *H01S 5/12*           (2021.01)
    *H01S 5/14*           (2006.01)

(52) U.S. Cl.
    CPC ............ H01S 5/1042 (2013.01); H01S 5/124 (2013.01); H01S 5/141 (2013.01); *H01S 5/0612* (2013.01)

(56) References Cited

U.S. PATENT DOCUMENTS

| | | | |
|---|---|---|---|
| 7,209,498 B1* | 4/2007 | Chapman | H01S 5/141 372/20 |
| 2015/0355482 A1* | 12/2015 | Akiyama | H01S 3/107 385/2 |
| 2017/0141539 A1* | 5/2017 | Ring | H01S 5/124 |
| 2018/0136400 A1* | 5/2018 | Wohlfeil | G02B 6/29347 |
| 2019/0025669 A1* | 1/2019 | Qureshi | H01S 5/0608 |

FOREIGN PATENT DOCUMENTS

| | | |
|---|---|---|
| CN | 103098488 A | 5/2013 |
| CN | 104966989 A | 10/2015 |
| CN | 106058621 A | 10/2016 |
| CN | 106785882 A | 5/2017 |
| TW | 200533024 A | 10/2005 |

\* cited by examiner

WAVELENGTH-TUNABLE LASER

CROSS-REFERENCE TO RELATED APPLICATIONS

This application is a continuation of International Application No. PCT/CN2019/091044, filed on Jun. 13, 2019, which claims priority to Chinese Patent Application No. 201810633315.8, filed on Jun. 20, 2018. The disclosures of the aforementioned applications are hereby incorporated by reference in their entireties.

TECHNICAL FIELD

This application relates to the field of optical communications technologies, and more specifically, to a wavelength-tunable laser.

BACKGROUND

In a dense wavelength division multiplexing (DWDM) network, a plurality of distributed feedback bragg grating (DFB) lasers are generally used to transmit a plurality of different wavelength channels. However, a transmit wavelength of each type of DFB laser is fixed. Therefore, a DWDM network needs to include optical transceiver modules of DFB lasers having different transmit wavelengths. In this way, in a manufacturing process of the DFB laser, a fine bragg grating structure needs to be additionally manufactured to limit the transmit wavelength, and as a result, a price of the DFB laser is difficult to reduce. In addition, requirements for DFB lasers having different transmit wavelengths cause an increase in types of optical transceiver modules, and consequently, costs in a process of goods preparation, installation, operation, and maintenance are increased.

In some approaches, a wavelength-tunable laser is used to replace a DFB laser having a fixed wavelength. However, the wavelength-tunable laser implements wavelength tuning based on a vernier effect of two groups of comb filters, and a wavelength tuning response is a complex multi-dimensional response diagram. Therefore, as a result, wavelength testing and calibration are complex.

Therefore, how to reduce complexity of wavelength tuning of a laser is an urgent problem to be resolved.

SUMMARY

This application provides a wavelength-tunable laser, to reduce complexity of wavelength tuning of a laser.

According embodiments discussed herein, a wavelength-tunable laser is provided. The wavelength-tunable laser includes a reflective gain unit, an optical phase shifter, a coupler, and a passive filter unit array, where an output port of the reflective gain unit is connected to an input port of the optical phase shifter, and the reflective gain unit is configured to reflect light in a resonant cavity of the laser and provide a gain of the laser;

an output port of the optical phase shifter is connected to an input port of the coupler, and the optical phase shifter is configured to adjust a cavity length of the resonant cavity of the laser, so that a cavity mode of the laser matches a center wavelength of a passive filter unit;

a first output port of the coupler is connected to an input port of the passive filter unit array, to input, to the passive filter unit array, light that needs to be filtered, and a second output port of the coupler is an output port of the laser; and the passive filter unit array includes a plurality of passive filter units, wavelength tuning ranges of any two of the plurality of passive filter units are different, and at a same moment, only one of the plurality of passive filter units performs filtering.

DESCRIPTION OF EMBODIMENTS

The following describes technical solutions of this application with reference to the accompanying drawings.

The technical solutions in the embodiments of this application may be applied to a dense wavelength division multiplexing (DWDM) system. In a dense wavelength division multiplexing system, different optical wavelengths carry different optical signals, and optical signals of different wavelengths are transmitted in a same optical fiber, to implement large-capacity and low-loss data communication.

When a laser provided in the embodiments of this application is applied to a DWDM system, the laser may emit light of a tunable wavelength, so that an optical transceiver module in a DWDM network does not need to include DFB lasers of different transmit wavelengths, and light of different wavelengths may be obtained by using the laser.

It should be understood that the laser provided in the embodiments of this application may be applied to the DWDM system, and certainly may also be applied to another optical communication scenario. This is not limited in the embodiments of this application.

This application provides a wavelength-tunable laser. The laser not only implements wavelength tuning of the laser, but also implements wavelength tuning without using a vernier effect, thereby reducing complexity of wavelength tuning, simplifying a wavelength tuning process of the laser, and further, reducing costs of the wavelength-tunable laser.

Figure 1:
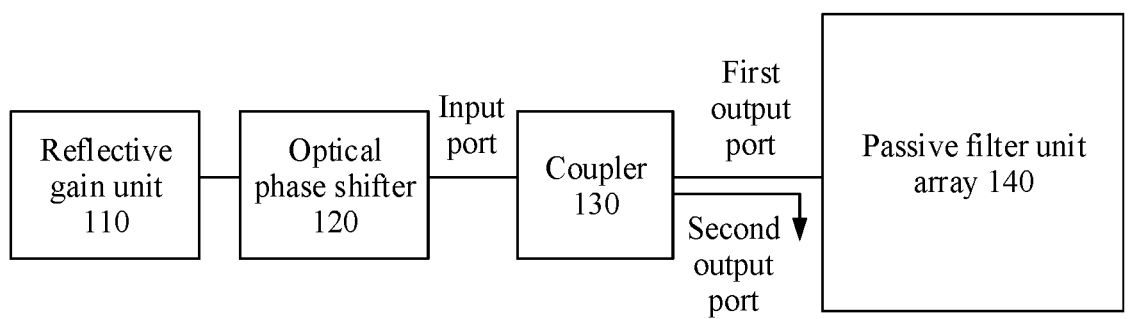
FIG. 1 is a schematic block diagram of a wavelength-tunable laser according to an embodiment of this application.

The following describes in detail a wavelength-tunable laser 100 provided in this application with reference to FIG. 1. FIG. 1 is a schematic block diagram of the wavelength-tunable laser 100 according to an embodiment of this application.

The laser 100 includes a reflective gain unit 110, an optical phase shifter 120, a coupler 130, and a passive filter unit array 140.

An output port of the reflective gain unit 110 is connected to an input port of the optical phase shifter 120, and the reflective gain unit is configured to reflect light in a resonant cavity of the laser and provide a gain of the laser.

An output port of the optical phase shifter 120 is connected to an input port of the coupler 130, and the optical phase shifter is configured to adjust a cavity length of the resonant cavity of the laser, so that a cavity mode of the laser matches a center wavelength of a passive filter unit.

A first output port of the coupler 130 is connected to an input port of the passive filter unit array, to input, to the passive filter unit array, light that needs to be filtered, and a second output port of the coupler 130 is an output port of the laser.

The passive filter unit array 140 includes a plurality of passive filter units, and wavelength tuning ranges of any two of the plurality of passive filter units are different, and at a same moment, only one of the plurality of passive filter units performs filtering.

Specifically, the reflective gain unit is not only configured to provide a gain for the laser 100, but also configured to reflect light in an optical resonant cavity of the laser, where the reflection is total reflection.

The optical phase shifter 120 changes a cavity length of the optical resonant cavity of the laser. It should be understood that, the optical phase shifter 120 is actually configured to adjust a phase of an optical path, so that an optical path length changes, thereby causing a change in the equivalent cavity length of the resonant cavity of the laser, so that the cavity mode of the laser matches the center wavelength of the passive filter unit used for filtering. The input port of the coupler 130 is connected to the output port of the optical phase shifter, the first output port of the coupler 130 is connected to the input port of the passive filter unit array, and the second output port of the coupler 130 is the output port of the laser. The passive filter unit array 140 includes a plurality of passive filter units, wavelength tuning ranges of any two of the plurality of passive filter units are different, and at a same moment, only one of the plurality of passive filter units performs filtering.

In addition, because any two of the plurality of passive filter units have different wavelength tuning ranges, when different passive filter units operate, the laser may output laser light having different wavelengths.

For example, the passive filter unit array includes three passive filter units. A wavelength tuning range of the first passive filter unit is 1550 nm to 1560 nm, a wavelength tuning range of the second passive filter unit is 1560 nm to 1570 nm, and a wavelength tuning range of the third passive filter unit is 1570 nm to 1580 nm. Therefore, when the first passive filter unit operates, a wavelength range of laser light output by the laser is 1550 nm to 1560 nm; when the second passive filter unit operates, a wavelength range of laser light output by the laser is 1560 nm to 1570 nm; when the third passive filter unit operates, a wavelength range of laser light output by the laser is 1570 nm to 1580 nm.

Therefore, in this embodiment of this application, the passive filter unit array enables the laser to emit wavelength-tunable laser light, and a wavelength of each filter unit is linearly tunable. In addition, at a same moment, only one of the plurality of passive filter units performs filtering. Therefore, control over the laser is relatively simple. It is avoided that wavelength tuning is implemented by using a vernier effect of two groups of comb filters, so that complexity of wavelength tuning of the wavelength-tunable laser can be reduced, thereby reducing costs.

Optionally, the reflective gain unit may be implemented based on a quantum well or a quantum dot of an IIIV family, and an operating wavelength may belong to a 1310 nm wavelength area, a 1550 nm wavelength area, or another area. A part other than the reflective gain unit may be implemented based on a waveguide structure of a platform of a material such as SOI, SiO2, or SiNx.

Optionally, in another embodiment of this application, each of the plurality of passive filter units includes a band-pass reflector, a tunable filter, and an optical switch, and the optical switch is configured to control whether light enters the tunable filter of the passive filter unit in which the optical switch is located, the tunable filter is configured to sift out light whose wavelength is a filter peak of the tunable filter, and the band-pass reflector is configured to reflect the sifted light; a wavelength tuning range of the tunable filter is within a bandwidth range of a reflection wavelength of the band-pass reflector, and within the bandwidth range of the reflection wavelength of the band-pass reflector, the tunable filter has one and only one filter peak; the input port of the passive filter unit array is an input port of an optical switch of a first passive filter unit in the passive filter unit array; a first output port of an optical switch of an $N^{th}$ passive filter unit is connected to an input port of a tunable filter of the $N^{th}$ passive filter unit, and an output port of the tunable filter of the $N^{th}$ passive filter unit is connected to an input port of a band-pass reflector of the $N^{th}$ passive filter unit; and a second output port of the optical switch of the $N^{th}$ passive filter unit is connected to an input port of an optical switch of an $(N+1)^{th}$ passive filter unit, and N is an integer with N≥1.

It should be understood that the band-pass reflector reflects light within a specific wavelength range. When a wavelength of light is not within a wavelength range corresponding to the band-pass reflector, the band-pass reflector does not reflect the light.

Figure 2:
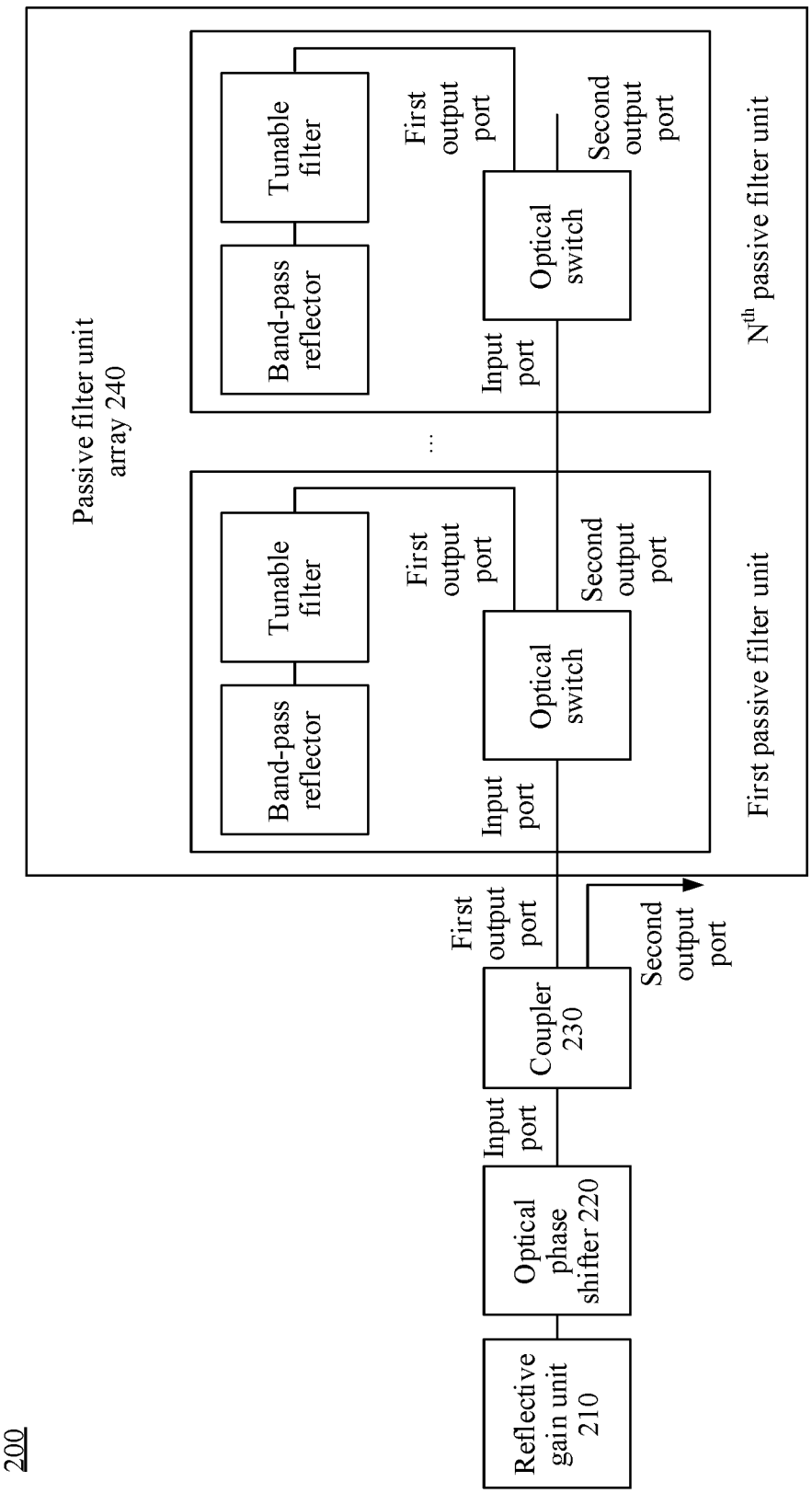
FIG. 2 is a schematic block diagram of a wavelength-tunable laser according to another embodiment of this application.

Specifically, FIG. 2 is a schematic block diagram of a wavelength-tunable laser 200 according to another embodiment of this application. The laser 200 includes a reflective gain unit 210, an optical phase shifter 220, a coupler 230, and a passive filter unit array 240.

It should be noted that, for understanding of the reflective gain unit 210, the optical phase shifter 2320, and the coupler 230, refer to the reflective gain unit 110, the optical phase shifter 120, and the coupler 130 in FIG. 1. To avoid repetition, details are not described herein again.

The passive filter unit array 240 includes a plurality of passive filter units, and each passive filter unit includes a tunable filter, an optical switch, and a band-pass reflector. An input port of the passive filter unit array is an input port of an optical switch of a first passive filter unit in the passive filter unit array, a first output port of the optical switch of the first passive filter unit is connected to an input port of a tunable filter of the first passive filter unit, an output port of the tunable filter of the first passive filter unit is connected to an input port of a band-pass reflector of the first passive filter unit, and a second output port of the optical switch of the first passive filter unit is connected to an input port of an optical switch of a second passive filter unit.

A second output port of an optical switch of an $(N-1)^{th}$ passive filter unit is connected to an input port of an optical switch of an $N^{th}$ passive filter unit, a first output port of the optical switch of the $N^{th}$ passive filter unit is connected to an input port of a tunable filter of the $N^{th}$ passive filter unit, an output port of the tunable filter of the $N^{th}$ passive filter unit is connected to an input port of a band-pass reflector of the $N^{th}$ passive filter unit, a second output port of the optical switch of the $N^{th}$ passive filter unit is connected to an input port of an optical switch of an $(N+1)^{th}$ passive filter unit, and N>1. The plurality of passive filter units are sequentially connected in a cascading manner to form the passive filter unit array 240.

A status of an optical switch of a current filter unit is changed, so that light enters the current filter unit or light is directly input to a next filter unit. For example, when the status of the optical switch of the first passive filter unit is on, light enters from the input port of the optical switch of the first passive filter unit, all enters into the tunable filter of the first passive filter unit from the first output port of the optical switch of the first passive filter unit, and no light is output from the second output port of the optical switch of the first passive filter unit, to form the wavelength-tunable laser determined by a center wavelength of the tunable filter of the first passive filter unit. When the status of the optical switch of the first passive filter unit is changed to off, light is directly input to the second passive filter unit from the second output port of the optical switch of the first passive filter unit, and the first output port of the optical switch of the first passive filter unit has no light output. Therefore, the tunable filter of the first passive filter unit is made "transparent", and an output wavelength of the laser is irrelevant to the tunable filter of the first passive filter unit. Therefore, light of a tunable wavelength is output by controlling statuses of optical switches of the plurality of passive filter units.

Optionally, in another embodiment of this application, the tunable filter is a microring resonator, and/or the optical switch is a Mach Zehnder interferometer (MZI).

Specifically, the tunable filter of the passive filter unit is implemented by using the microring resonator, or the optical switch of the passive filter unit is implemented by using the MZI, or the tunable filter of the passive filter unit is implemented by using the microring resonator, and the optical switch of the passive filter unit is implemented by using the MZI.

Optionally, in another embodiment of this application, when the optical switch is the MZI, the MZI includes two couplers; the input port of the passive filter unit array is a first input port of a first coupler of the first passive filter unit in the passive filter unit array; a first output port of a first coupler of the $N^{th}$ passive filter unit is connected to a first input port of a second coupler of the $N^{th}$ passive filter unit, a second output port of the first coupler is connected to a second input port of the second coupler, a first output port of the second coupler is connected to the input port of the tunable filter of the $N^{th}$ passive filter unit, a second output port of the second coupler is connected to an input port of a first coupler of the $(N+1)^{th}$ passive filter unit, the first coupler and the second coupler form an MZI, and N≥1; a phase shifter covers an optical waveguide that connects a first output port of the first coupler and a first input port of the second coupler, and/or a phase shifter covers an optical waveguide that connects a second output port of the first coupler and a second input port of the second coupler, and the phase shifter implements switching of an optical signal between a first output port and a second output port of the second coupler by changing a difference between phases of two arms of the MZI, functioning as the optical switch; and an output port of a tunable filter of the $N^{th}$ passive filter unit is connected to an input port of a band-pass reflector of the $N^{th}$ passive filter unit. Optionally, the phase shifter includes any component that can change a phase, such as an electrothermal electrode. This is not limited in this application.

Figure 3:
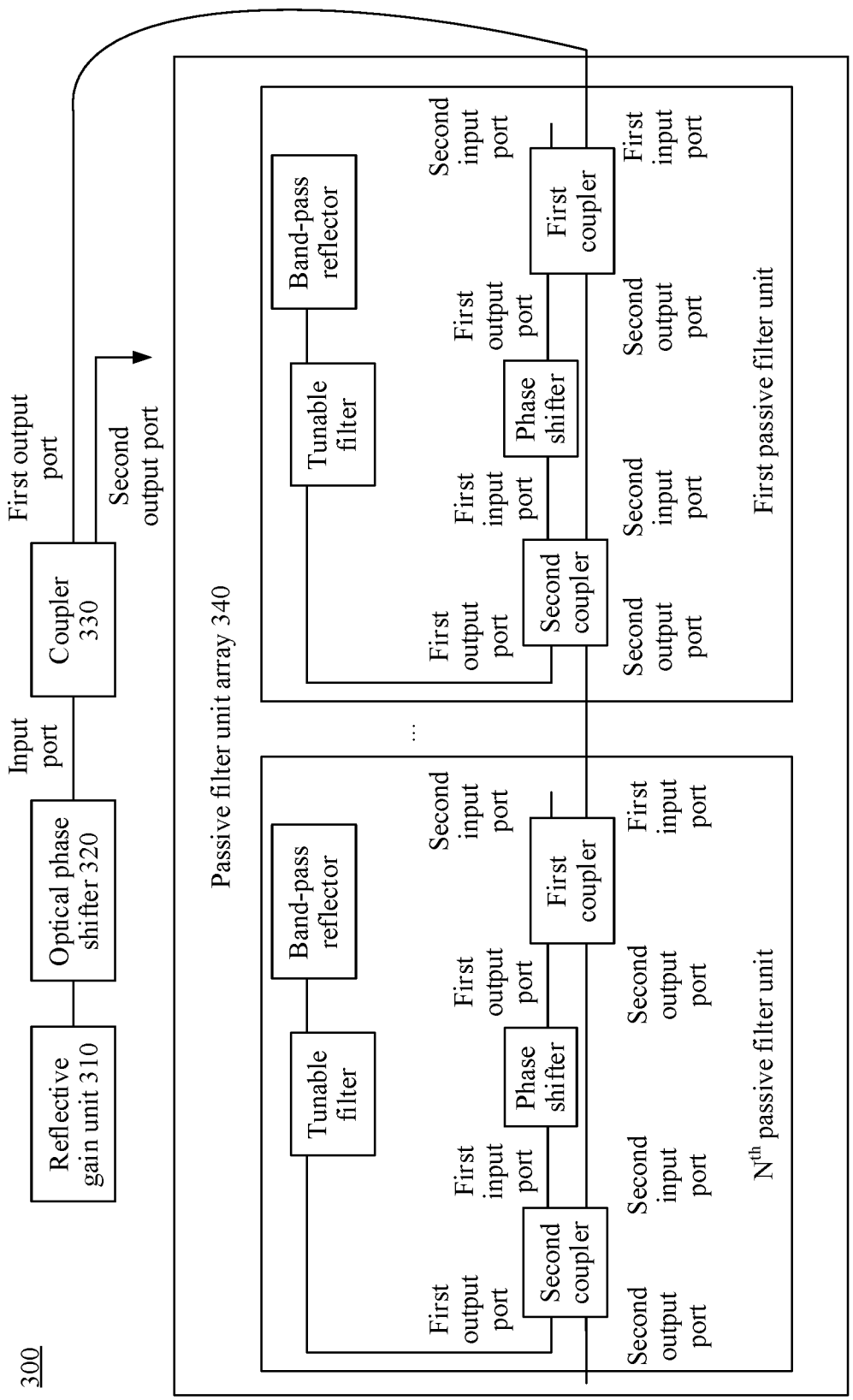
FIG. 3 is a schematic block diagram of a wavelength-tunable laser according to another embodiment of this application.

Specifically, FIG. 3 is a schematic block diagram of a wavelength-tunable laser 300 according to another embodiment of this application. The laser 300 includes a reflective gain unit 310, an optical phase shifter 320, a coupler 330, and a passive filter unit array 340.

It should be noted that, for understanding of the reflective gain unit 310, the optical phase shifter 320, and the coupler 330, refer to the reflective gain unit 110, the optical phase shifter 120, and the coupler 130 in FIG. 1. To avoid repetition, details are not described herein again.

The passive filter unit array 340 includes a plurality of passive filter units, each passive filter unit includes a tunable filter, an MZI, and a band-pass reflector, and the MZI includes two couplers. An input port of the passive filter unit array is a first input port of a first coupler of an MZI of a first passive filter unit in the passive filter unit array, a first output port of the first coupler is connected to a first input port of a second coupler of the first passive filter unit, a second output port of the first coupler is connected to a second input port of the second coupler, a first output port of the second coupler is connected to an input port of a tunable filter of the first passive filter unit, a second output port of the second coupler is connected to an input port of a first coupler of a second passive filter unit, and the first coupler of the first passive filter unit and the second coupler of the first passive filter unit form the MZI; a phase shifter covers an optical waveguide that connects the first output port of the first coupler and the first input port of the second coupler; an output port of the tunable filter of the first passive filter unit is connected to an input port of a band-pass reflector of the first passive filter unit.

A second output port of a second coupler of an MZI of an $(N-1)^{th}$ passive filter unit is connected to an input port of a first coupler of an MZI of an $N^{th}$ passive filter unit, a first output port of the first coupler is connected to the first input port of the second coupler of the first passive filter unit, a second output port of the first coupler is connected to the second input port of the second coupler, and the first output port of the second coupler is connected to the input port of the tunable filter of the first passive filter unit; a phase shifter covers an optical waveguide that connects the first output port of the first coupler and the first input port of the second coupler; the second output port of the second coupler is connected to an input port of a first coupler of an $(N+1)^{th}$ passive filter unit; an output port of a tunable filter of the $N^{th}$ passive filter unit is connected to an input port of a band-pass reflector of the $N^{th}$ passive filter unit, and N≥1. The plurality of passive filter units are sequentially connected in a cascading manner to form the passive filter unit array 340.

It should be understood that the first coupler in the MZI may be a 1×2 coupler, or may be a 2×2 coupler. A specific structure of the coupler in the MZI is not limited in this application.

It should be further understood that a phase shifter covers any one or two optical waveguides in the MZI.

Optionally, in another embodiment of this application, when the tunable filter is the microring resonator, the microring resonator includes two couplers; the input port of the passive filter unit array is the input port of the optical switch of the first passive filter unit in the passive filter unit array; the first output port of the optical switch of the $N^{th}$ passive filter unit is connected to a first input port of a first coupler of the $N^{th}$ passive filter unit, a first output port of the first coupler is connected to a first input port of a second coupler of the $N^{th}$ passive filter unit, a first output port of the second coupler is connected to a second input port of the first coupler, the first coupler and the second coupler form a microring resonator, and $N≥1$; a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator; a second output port of the second coupler is connected to the input port of the band-pass reflector of the $N^{th}$ passive filter unit, and the second output port of the optical switch of the $N^{th}$ passive filter unit is connected to the input port of the optical switch of the $(N+1)^{th}$ passive filter unit.

Figure 4:
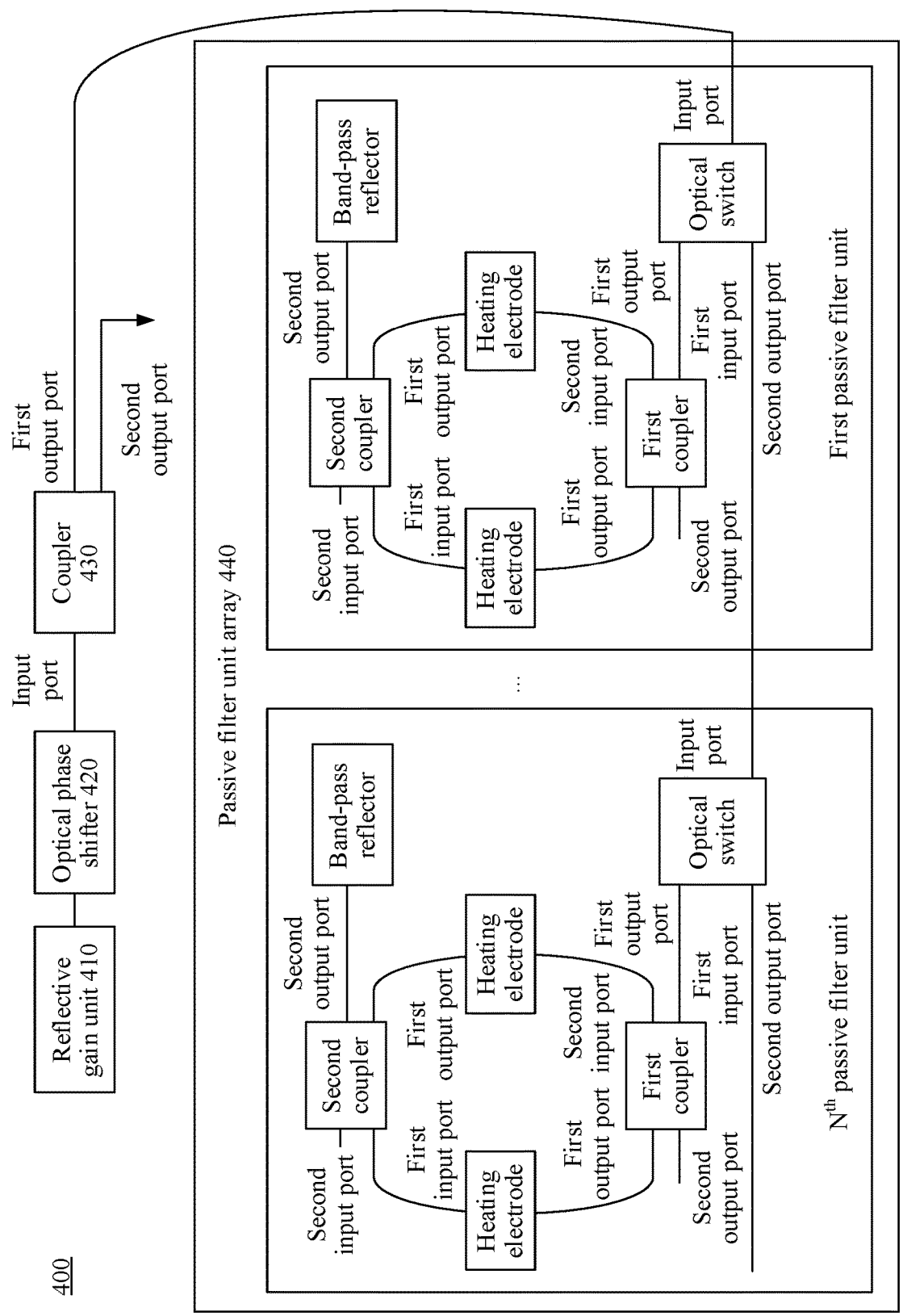
FIG. 4 is a schematic block diagram of a wavelength-tunable laser according to another embodiment of this application.

Specifically, FIG. 4 is a schematic block diagram of a wavelength-tunable laser 400 according to another embodiment of this application. The laser 400 includes a reflective gain unit 410, an optical phase shifter 420, a coupler 430, and a passive filter unit array 440.

It should be noted that, for understanding of the reflective gain unit 410, the optical phase shifter 420, and the coupler 430, refer to the reflective gain unit 110, the optical phase shifter 120, and the coupler 130 in FIG. 1. To avoid repetition, details are not described herein again.

The passive filter unit array 440 includes a plurality of passive filter units, each passive filter unit includes a microring resonator, an optical switch, and a band-pass reflector, and the microring resonator includes two 2×2 couplers. An input port of the passive filter unit array is an input port of an optical switch of a first passive filter unit in the passive filter unit array; a first output port of the optical switch of the first passive filter unit is connected to a first input port of a first coupler of the first passive filter unit, a first output port of the first coupler is connected to a first input port of a second coupler of the first passive filter unit, a first output port of the second coupler is connected to a second input port of the first coupler, and the first coupler and the second coupler form a microring resonator; a heating electrode covers an optical waveguide that connects the first output port of the first coupler and the first input port of the second coupler, and a heating electrode covers an optical waveguide that connects the first output port of the second coupler and the second input port of the first coupler; a second output port of the second coupler is connected to an input port of a band-pass reflector of the first passive filter unit, and a second output port of the optical switch of the first passive filter unit is connected to an input port of an optical switch of a second passive filter unit.

A second output port of an optical switch of an $(N-1)^{th}$ passive filter unit is connected to an input port of an optical switch of an $N^{th}$ first passive filter unit; a first output port of the optical switch of the $N^{th}$ passive filter unit is connected to a first input port of a first coupler of the $N^{th}$ passive filter unit, a first output port of the first coupler is connected to a first input port of a second coupler of the $N^{th}$ passive filter unit, a first output port of the second coupler is connected to a second input port of the first coupler, and the first coupler and the second coupler form a microring resonator; a heating electrode covers an optical waveguide that connects the first output port of the first coupler and the first input port of the second coupler, and a heating electrode covers an optical waveguide that connects the first output port of the second coupler and the second input port of the first coupler; a second output port of the second coupler is connected to an input port of a band-pass reflector of the $N^{th}$ passive filter unit, a second output port of the optical switch of the $N^{th}$ passive filter unit is connected to an input port of an optical switch of an $(N+1)^{th}$ passive filter unit, and $N≥1$. The plurality of passive filter units are sequentially connected in a cascading manner to form the passive filter unit array 440.

It should be understood that, that the microring resonator includes two 2×2 couplers is merely an implementable manner, and the microring resonator may further include another quantity of couplers and another type of coupler. This is not limited in this application.

It should be further understood that, in the microring resonator shown in FIG. 4, heating electrodes cover two optical waveguides forming the microring resonator, but a heating electrode may cover any one of the optical waveguides in the microring resonator.

Optionally, in another embodiment of this application, when the tunable filter is the microring resonator, and the optical switch is the Mach Zehnder interferometer (MZI), the microring resonator includes a first coupler, a second coupler, and a third coupler, and the MZI includes the first coupler and the second coupler;

the input port of the passive filter unit array is a first input port of a first coupler of the first passive filter unit in the passive filter unit array;

a first output port of a first coupler of the $N^{th}$ passive filter unit is connected to a first input port of a second coupler of the $N^{th}$ passive filter unit, a first output port of the second coupler is connected to a first input port of a third coupler of the $N^{th}$ passive filter unit, and a first output port of the third coupler is connected to a second input port of the first coupler; a heating electrode covers an optical waveguide that connects the first output port of the second coupler and the first input port of the third coupler, and/or a heating electrode covers an optical waveguide that connects the first output port of the third coupler and the second input port of the first coupler, and the heating electrode is configured to change a filter center wavelength of the microring resonator by changing a cavity length of the microring resonator;

a second output port of the first coupler is connected to a second input port of the second coupler, and a second output port of the second coupler is connected to a first input port of a first coupler of an $(N+1)^t$ passive filter unit; a phase shifter covers an optical waveguide that connects the first output port of the first coupler and the first input port of the second coupler, and/or a phase shifter covers an optical waveguide that connects the second output port of the first coupler and the second input port of the second coupler, the phase shifter implements switching of an optical signal between a first output port and a second output port of the second coupler by changing a difference between phases of two arms of the MZI, and $N≥1$; and a second output port of the third coupler is connected to the input port of the band-pass reflector of the $N^{th}$ passive filter unit.

Figure 5:
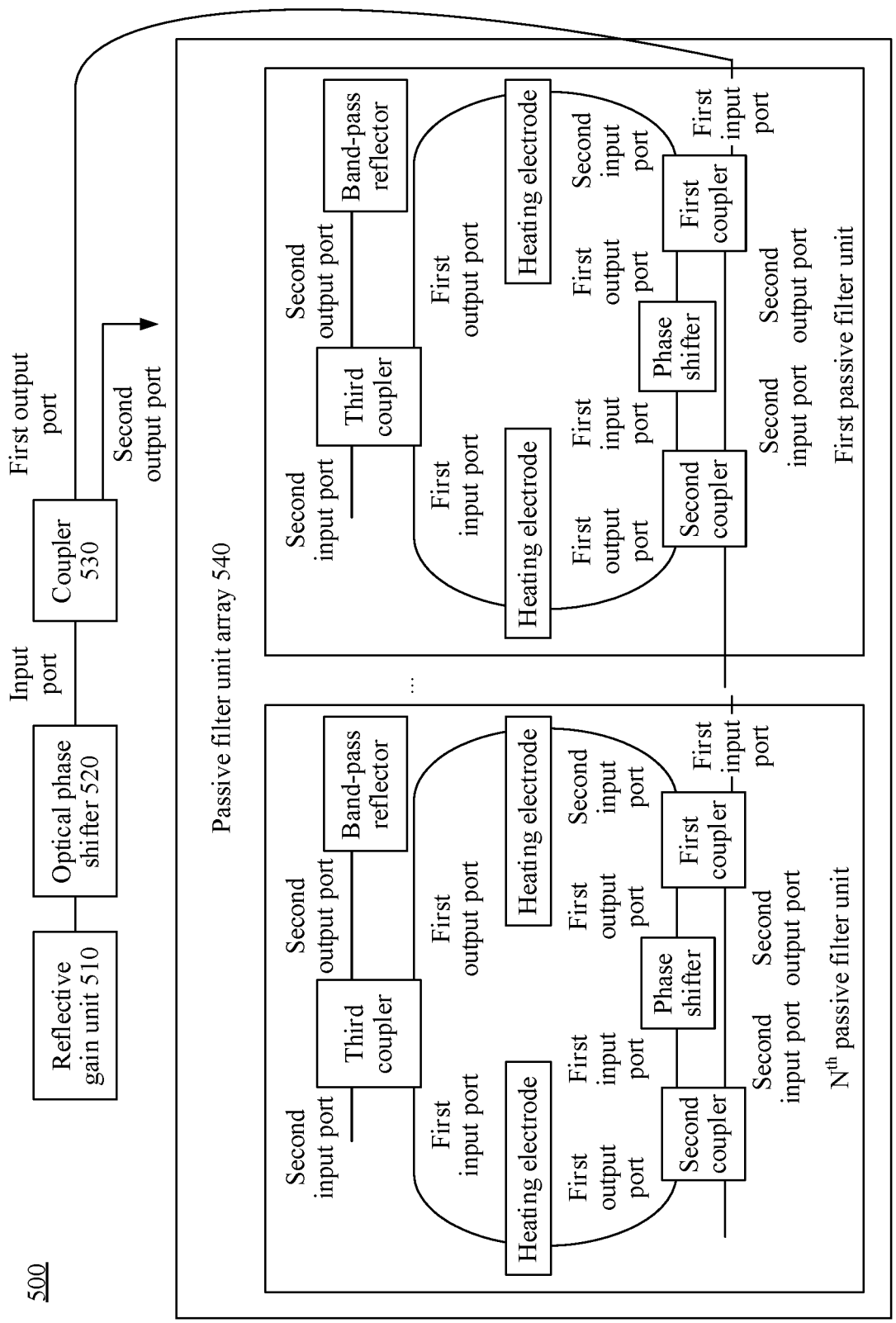
FIG. 5 is a schematic block diagram of a wavelength-tunable laser according to another embodiment of this application.

Specifically, FIG. 5 is a schematic block diagram of a wavelength-tunable laser 500 according to another embodiment of this application. The laser 500 includes a reflective gain unit 510, an optical phase shifter 520, a coupler 530, and a passive filter unit array 540.

It should be noted that, for understanding of the reflective gain unit 510, the optical phase shifter 520, and the coupler 530, refer to the reflective gain unit 110, the optical phase shifter 120, and the coupler 130 in FIG. 1. To avoid repetition, details are not described herein again.

The passive filter unit array 540 includes a plurality of passive filter units, and each passive filter unit includes a microring resonator, an MZI, and a band-pass reflector. The microring resonator is configured to select light of a fixed wavelength, and the MZI is equivalent to an optical switch and determines whether light enters a current passive filter unit. Each passive filter unit includes three 2×2 couplers, and the three 2×2 couplers are connected to form the microring resonator and the MZI. An input port of the passive filter unit array is a first input port of a first coupler of the first passive filter unit in the passive filter unit array.

The following describes in detail a connection structure between the three 2×2 couplers of the first passive filter unit.

A first output port of a first coupler of a first passive filter unit is connected to a first input port of a second coupler of the first passive filter unit, a first output port of the second coupler is connected to a first input port of a third coupler of the first passive filter unit, a first output port of the third coupler is connected to a second input port of the first coupler, and in this case, the first coupler, the second coupler, and the third coupler form a microring resonator; a heating electrode covers an optical waveguide that connects the first output port of the second coupler and the first input port of the third coupler, and a heating electrode covers an optical waveguide that connects the first output port of the third coupler and the second input port of the first coupler.

A second output port of the first coupler is connected to a second input port of the second coupler, and a first output port of the first coupler is connected to a first input port of the second coupler of the first passive filter unit. In this case, the first coupler and the second coupler form an MZI, and a phase shifter covers an optical waveguide that connects the first output port of the first coupler and the second input port of the second coupler.

In addition, a second output port of the second coupler is connected to a first input port of a first coupler of a second passive filter unit, and a second output port of the third coupler is connected to a band-pass reflector of the first passive filter unit.

A first output port of a first coupler of an $N^{th}$ passive filter unit is connected to a first input port of a second coupler of the $N^{th}$ passive filter unit, a first output port of the second coupler is connected to a first input port of a third coupler of the $N^{th}$ passive filter unit, and a first output port of the third coupler is connected to a second input port of the first coupler; a heating electrode covers an optical waveguide that connects the first output port of the second coupler and the first input port of the third coupler, and a heating electrode covers an optical waveguide that connects the first output port of the third coupler and the second input port of the first coupler. A second output port of the first coupler is connected to a second input port of the second coupler, and the second output port of the second coupler is connected to a first input port of a first coupler of an $(N+1)^{th}$ passive filter unit; a phase shifter covers an optical waveguide that connects the first output port of the first coupler and the first input port of the second coupler, and $N \geq 1$. The plurality of passive filter units are sequentially connected in a cascading manner to form the passive filter unit array 640.

A status of an MZI of a current filter unit is changed, so that light enters the current filter unit or light is directly input to a next filter unit. For example, when the status of the MZI of the first passive filter unit is on, light is input to the microring resonator of the first passive filter unit from the first output port of the second coupler of the first passive filter unit, to form the wavelength-tunable laser determined by a center wavelength of the microring resonator of the first passive filter unit. When the status of the MZI of the first passive filter unit is changed to off, light is directly input to the second passive filter unit from the second output port of the second coupler of the first passive filter unit, and the first output port of the MZI of the first passive filter unit has no light output. Therefore, the microring resonator of the first passive filter unit is made "transparent", and an output wavelength of the laser is irrelevant to the microring resonator of the first passive filter unit. Therefore, light of a tunable wavelength is output by controlling statuses of MZIs of the plurality of passive filter units.

It should be understood that, that each passive filter unit includes three 2×2 couplers is merely an implementable manner, and each passive filter unit may further include another quantity of couplers, configured to form a microring resonator and an MZI. This is not limited in this application.

It should be further understood that, in the microring resonator shown in FIG. 5, heating electrodes cover two optical waveguides forming the microring resonator, but a heating electrode may cover any one of the optical waveguides in the microring resonator.

Optionally, a free spectral region of the microring resonator is equal to a free spectral region of the MZI.

Specifically, when the free spectral region of the microring resonator of each passive filter unit is equal to the free spectral region of the MZI, the MZI may be completely turned on or completely turned off as an optical switch.

Optionally, when the MZI is turned off, light enters the first input port of the first coupler of the $(N+1)^{th}$ passive filter unit from the second output port of the second coupler.

When the MZI is turned on, light enters the first input port of the third coupler from the first output port of the second coupler.

Specifically, a status of an MZI of a current filter unit is changed, so that light enters the current filter unit or light is directly input to a next filter unit. The free spectral region of the microring resonator of each passive filter unit is equal to the free spectral region of the MZI. When the free spectral regions are equal, the MZI may be completely turned on or turned off as an optical switch. The MZI of the first passive filter unit is used to describe an off state or an on state of the MZI. By default, a difference between phases of two arms of the MZI is one π phase (the two arms are two optical paths connected between the first coupler and the second coupler, to be specific, one optical path is an optical path between the first output port of the first coupler and the first input port of the second coupler, and the other optical path is an optical path between the second output port of the first coupler and the second input port of the second coupler). In this case, the MZI is in a completely off state (to be specific, the first output port of the second coupler of the MZI has no light output), and light is directly output from the second output port of the second coupler of the MZI to the second passive filter unit. When a length of an interference arm of the MZI is changed by using the phase shifter that covers the first output port of the first coupler and the first input port of the second coupler, and a difference between the two interference arms is not one π phase, the MZI changes from the completely off state to an on state, and light is input from the first output port of the second coupler and coupled into a first microring resonator. In this case, a filtering effect formed by the first microring resonator determines a lasing wavelength of the laser.

It should be understood that, when the difference between the phases of the two arms of the MZI is one π phase, the MZI is completely off. When the difference between the phases of the two arms of the MZI is not one π phase, the MZI changes from the completely off state to the on state. In this case, light is input from the first output port of the second coupler and coupled into the first microring resonator, and some light is output from the second output port of the second coupler of the MZI to the second passive filter unit. To enable the filtering effect formed by the first microring resonator to determine the lasing wavelength of the laser, an MZI of another passive filter unit in the passive filter unit array needs to be controlled to be completely turned off, that is, a difference between phases of two arms of the MZI of the another passive filter units is one π phase.

When the difference between the phases of the two arms of the MZI is not one π phase, the MZI changes from the completely off state to the on state, but in this case, the on state is not completely on. To be specific, when light is input from the first output port of the second coupler and coupled into the first microring resonator, some light is output from the second output port of the second coupler of the MZI to the second passive filter unit. To enable the light to be completely input from the first output port of the second coupler and coupled into the first microring resonator, the MZI needs to be in the completely on state. To be specific, when a coupling ratio at which light is input from the first coupler and coupled into the first microring resonator is equal to a coupling ratio of the third coupler, the MZI changes from the off state to the completely on state.

Optionally, in another embodiment of this application, the passive filter unit array includes a waveband multiplexer, an input port of the passive filter unit array is an input port of the waveband multiplexer, and each of a plurality of output ports of the waveband multiplexer is connected to one passive filter unit;

each of the plurality of passive filter units includes a tunable filter, an optical switch, and a reflector;

the optical switch is configured to control whether light enters the reflector, the tunable filter is configured to sift out light whose wavelength is a filter peak of the tunable filter, and the reflector is configured to reflect the sifted light;

a wavelength tuning range of the tunable filter is within a filter bandwidth range of an output port of a waveband multiplexer connected to the passive filter unit in which the tunable filter is located, and the tunable filter has one and only one filter peak within the filter bandwidth range of the output port;

an $N^{th}$ output port of the plurality of output ports of the waveband multiplexer is connected to an input port of a tunable filter of an $N^{th}$ passive filter unit, and N≥1; an output port of the tunable filter of the $N^{th}$ passive filter unit is connected to an input port of an optical switch of the $N^{th}$ passive filter unit; and an output port of the optical switch of the $N^{th}$ passive filter unit is connected to an input port of a reflector of the $N^{th}$ passive filter unit.

Figure 6:
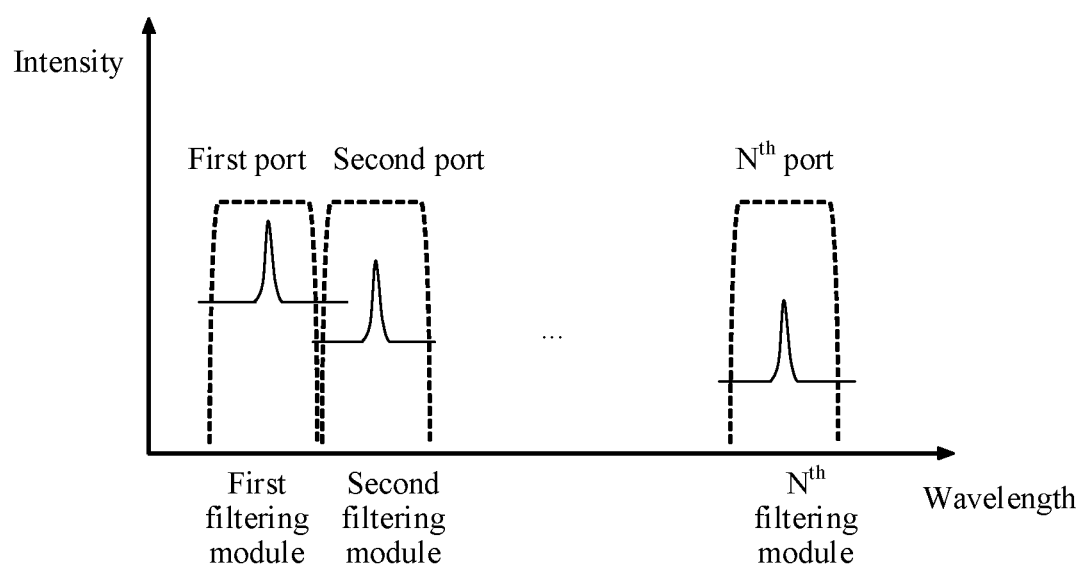
FIG. 6 is a schematic diagram of demultiplexing of demultiplexing ports of a waveband multiplexer according to this application.

Specifically, a feature of the waveband multiplexer is shown in FIG. 6. FIG. 6 is a schematic diagram of demultiplexing of the waveband multiplexer. The waveband multiplexer includes a multiplexing port and demultiplexing ports. The multiplexing port of the waveband multiplexer is an input port of the waveband multiplexer, and the demultiplexing ports of the waveband multiplexer are a plurality of output ports of the waveband multiplexer. The waveband multiplexer shown in FIG. 6 includes N demultiplexing ports, each demultiplexing port corresponds to a different wavelength range, and the N demultiplexing ports evenly divide, according to wavelengths, optical waves input by the multiplexing port into N parts. In a filter bandwidth range of the waveband multiplexer, the tunable filter has one and only one filter peak. For example, the waveband multiplexer includes three demultiplexing ports, and light input from the multiplexing port ranges from 1550 nm to 1580 nm. In this case, the three demultiplexing ports evenly divide the input light into three parts according to a wavelength range. A wavelength range corresponding to a first demultiplexing port is 1550 nm to 1560 nm, a wavelength range corresponding to a second demultiplexing port is 1560 nm to 1570 nm, and a wavelength range corresponding to a third demultiplexing port is 1570 nm to 1580 nm.

Figure 7:
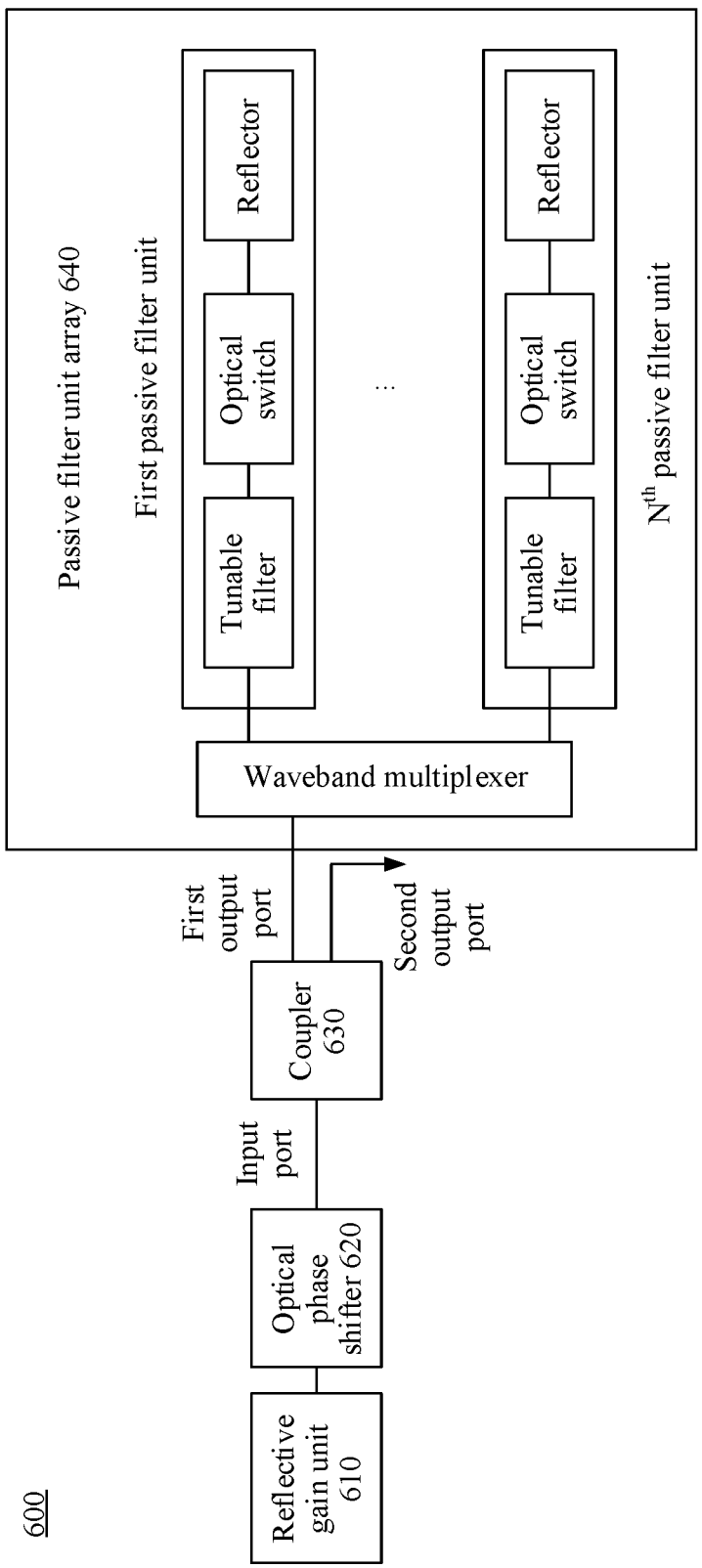
FIG. 7 is a schematic block diagram of a wavelength-tunable laser according to another embodiment of this application.

Specifically, FIG. 7 is a schematic block diagram of a wavelength-tunable laser 600 according to another embodiment of this application. The laser 600 includes a reflective gain unit 610, an optical phase shifter 620, a coupler 630, and a passive filter unit array 640.

It should be noted that, for understanding of the reflective gain unit 610, the optical phase shifter 620, and the coupler 630, refer to the reflective gain unit 110, the optical phase shifter 120, and the coupler 130 in FIG. 1. To avoid repetition, details are not described herein again.

The passive filter unit array 640 includes a waveband multiplexer and a plurality of passive filter units, and each passive filter unit includes a tunable filter, an optical switch, and a reflector. Each output port of the waveband multiplexer is connected to one passive filter unit. For example, a first output port of the waveband multiplexer is connected to an input port of a first tunable filter of a first passive filter unit, an $N^{th}$ output port of the waveband multiplexer is connected to an input port of an $N^{th}$ tunable filter of the first passive filter unit, N and the tunable filter of each passive filter unit is sequentially connected to the optical switch and the reflector.

Optionally, the tunable filter is a microring resonator, and/or the optical switch is an MZI.

Optionally, in another embodiment of this application, the tunable filter is the microring resonator.

Figure 8:
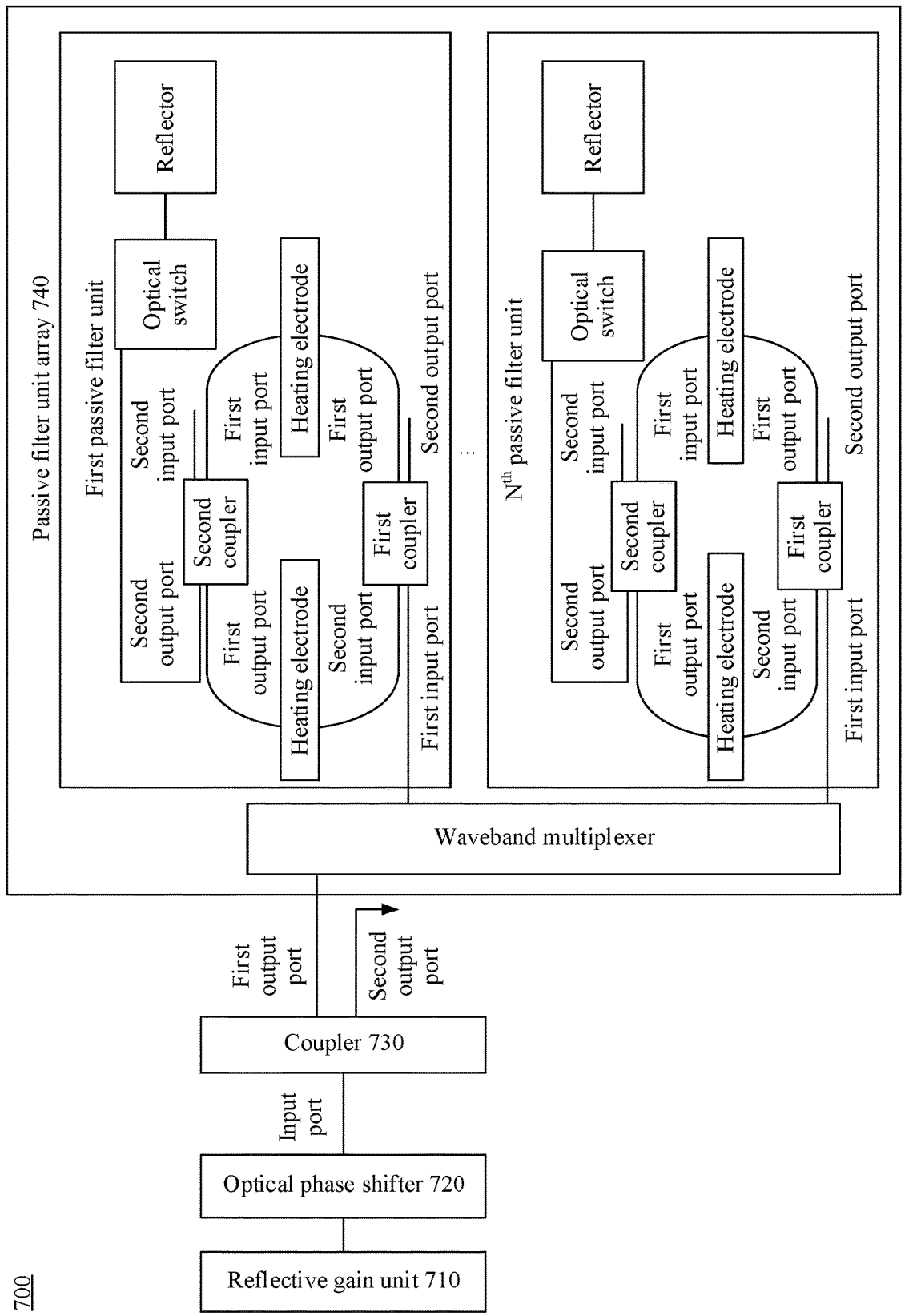
FIG. 8 is a schematic block diagram of a wavelength-tunable laser according to another embodiment of this application.

The microring resonator includes two couplers; a first input port of a first coupler of the $N^{th}$ passive filter unit is connected to the $N^{th}$ output port of the waveband multiplexer, a first output port of the first coupler is connected to a first input port of a second coupler of the $N^{th}$ passive filter unit, and a first output port of the second coupler is connected to a second input port of the first coupler; a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator; and a second output port of the second coupler is connected to the input port of the optical switch of the $N^{th}$ passive filter unit, the output port of the optical switch of the $N^{th}$ passive filter unit is connected to the reflector of the $N^{th}$ passive filter unit, and Specifically, FIG. 8 is a schematic block diagram of a wavelength-tunable laser 700 according to another embodiment of this application. The laser 700 includes a reflective gain unit 710, an optical phase shifter 720, a coupler 730, and a passive filter unit array 740.

It should be noted that, for understanding of the reflective gain unit 710, the optical phase shifter 720, and the coupler 730, refer to the reflective gain unit 110, the optical phase shifter 120, and the coupler 130 in FIG. 1. To avoid repetition, details are not described herein again.

The passive filter unit array 740 includes a waveband multiplexer, an input port of the passive filter unit array 740 is an input port of the waveband multiplexer, and the passive filter unit array 740 includes a plurality of passive filter units, and one of the plurality of output ports of the waveband multiplexer is connected to one passive filter unit. As shown in FIG. 8, a first output port of the waveband multiplexer is connected to a first passive filter unit, an $N^{th}$ output port of the waveband multiplexer is connected to an $N^{th}$ passive filter unit, and N≥1.

The passive filter unit array 840 includes a plurality of passive filter units, and each passive filter unit includes a microring resonator, an optical switch, and a reflector. The microring resonator is configured to select light of a fixed wavelength, and the optical switch determines whether light enters a current passive filter unit. The microring resonator includes two 2×2 couplers. The following describes in detail a connection structure of the first passive filter unit.

A first input port of a first coupler of the first passive filter unit is connected to a first output port of the waveband multiplexer, a first output port of the first coupler is connected to a first input port of a second coupler of the first passive filter unit, a first output port of the second coupler is connected to a second input port of the first coupler, and the first coupler and the second coupler form the microring resonator; a heating electrode covers an optical waveguide that connects the first output port of the first coupler and the first input port of the second coupler, and a heating electrode covers an optical waveguide that connects the first output port of the second coupler and the second input port of the first coupler. A second output port of the second coupler is connected to an input port of an optical switch of the first passive filter unit, and an output port of the optical switch of the first passive filter unit is connected to a reflector of the first passive filter unit.

A connection structure of the $N^{th}$ passive filter unit is the same as a connection structure of the first passive filter unit, and may be understood with reference to the connection structure of the first passive filter unit.

It should be understood that, that each passive filter unit includes two 2×2 couplers is merely an implementable manner, and each passive filter unit may further include another quantity of couplers, configured to form a microring resonator. This is not limited in this application.

It should be further understood that, in the microring resonator shown in FIG. 8, heating electrodes cover two optical waveguides forming the microring resonator, but a heating electrode may cover any one of the optical waveguides in the microring resonator.

Optionally, in another embodiment of this application, when the optical switch is the MZI, the MZI includes two couplers; the input port of the tunable filter of the $N^{th}$ passive filter unit is connected to the $N^{th}$ output port of the waveband multiplexer; the output port of the tunable filter is connected to an input port of a first coupler of the $N^{th}$ passive filter unit; a first output port of the first coupler is connected to a first input port of a second coupler of the $N^{th}$ passive filter unit, and a second output port of the first coupler is connected to a second input port of the second coupler; a phase shifter covers an optical waveguide that connects the first output port of the first coupler and the first input port of the second coupler, and/or a phase shifter covers an optical waveguide that connects the second output port of the first coupler and the second input port of the second coupler, and the phase shifter implements switching of an optical signal between a first output port and a second output port of the second coupler by changing a difference between phases of two arms of the MZI; and an output port of the second coupler is connected to the reflector of the $N^{th}$ passive filter unit, and N≥1.

Figure 9:
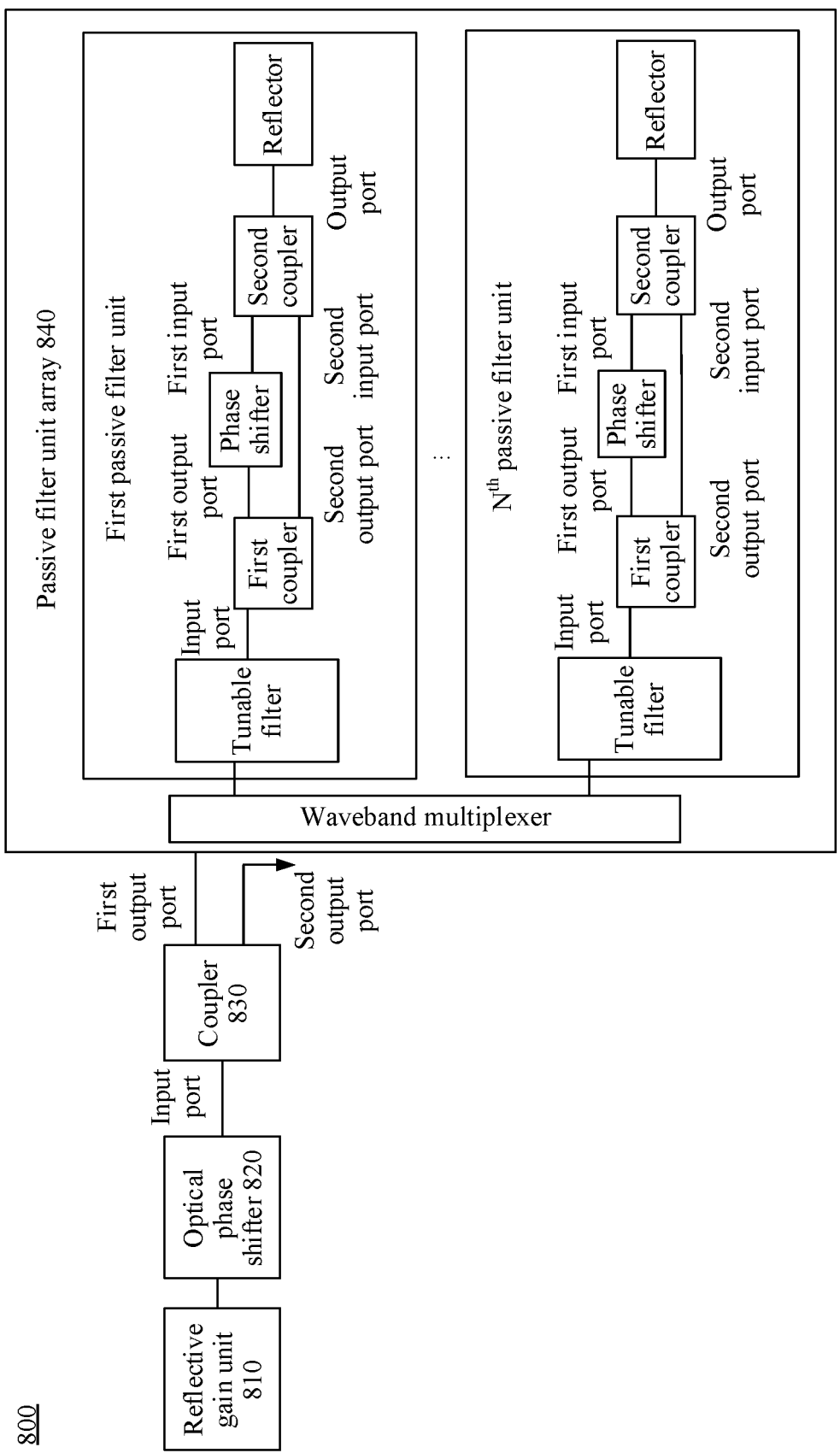
FIG. 9 is a schematic block diagram of a wavelength-tunable laser according to another embodiment of this application.

Specifically, FIG. 9 is a schematic block diagram of a wavelength-tunable laser 800 according to another embodiment of this application. The laser 800 includes a reflective gain unit 810, an optical phase shifter 820, a coupler 830, and a passive filter unit array 840.

It should be noted that, for understanding of the reflective gain unit 810, the optical phase shifter 820, and the coupler 830, refer to the reflective gain unit 110, the optical phase shifter 120, and the coupler 130 in FIG. 1. To avoid repetition, details are not described herein again.

For a specific connection manner between a waveband multiplexer included in the passive filter unit array 840 and a plurality of tunable filters included in the passive filter unit array 840, refer to a corresponding connection manner in the laser 600. Details are not described herein again.

The passive filter unit array 840 includes a plurality of passive filter units, and each passive filter unit includes a tunable filter, an MZI, and a reflector. The tunable filter is configured to select light of a fixed wavelength, and the MZI determines whether light enters a current passive filter unit. The MZI includes two 1×2 couplers. The following describes in detail a connection structure of the first passive filter unit.

An input port of a tunable filter of the first passive filter unit is connected to a first output port of the waveband multiplexer, an output port of the tunable filter is connected to an input port of a first coupler of the first passive filter unit, a first output port of the first coupler is connected to a first input port of a second coupler of the first passive filter unit, a second output port of the first coupler is connected to a second input port of the second coupler, and the first coupler and the second coupler form the MZI; a phase shifter covers an optical waveguide that connects the first output port of the first coupler and the first input port of the second coupler, and an output port of the second coupler is connected to a reflector of the first passive filter unit.

A connection structure of the $N^{th}$ passive filter unit is the same as a connection structure of the first passive filter unit, and may be understood with reference to the connection structure of the first passive filter unit.

It should be understood that the first coupler in the MZI may alternatively be a 2×2 coupler. A specific structure of the coupler in the MZI is not limited in this application.

It should be further understood that a phase shifter covers any one or two optical waveguides in the MZI.

Optionally, in another embodiment of this application, the optical switch is the MZI, the tunable filter is the microring resonator, the microring resonator includes a first coupler and a second coupler, and the MZI includes a third coupler and a fourth coupler; a first input port of a first coupler of the $N^{th}$ passive filter unit is connected to the $N^{th}$ output port of the waveband multiplexer, a first output port of the first coupler is connected to a first input port of a second coupler of the $N^{th}$ passive filter unit, and a first output port of the second coupler is connected to a second input port of the first coupler; a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator; a second output port of the second coupler is connected to a first input port of a third coupler of the $N^{th}$ passive filter unit, a first output port of the third coupler is connected to a first input port of a fourth coupler of the $N^{th}$ passive filter unit, and a second output port of the third coupler is connected to a second input port of the fourth coupler; a phase shifter covers an optical waveguide that connects the first output port of the third coupler and the first input port of the fourth coupler, and/or a phase shifter covers an optical waveguide that connects the second output port of the third coupler and the second input port of the fourth coupler, and the phase shifter implements switching of an optical signal between a first output port and a second output port of the fourth coupler by changing a difference between phases of two arms of the MZI; and a first output port of the fourth coupler is connected to the reflector of the $N^{th}$ passive filter unit, and $N \geq 1$.

Figure 10:
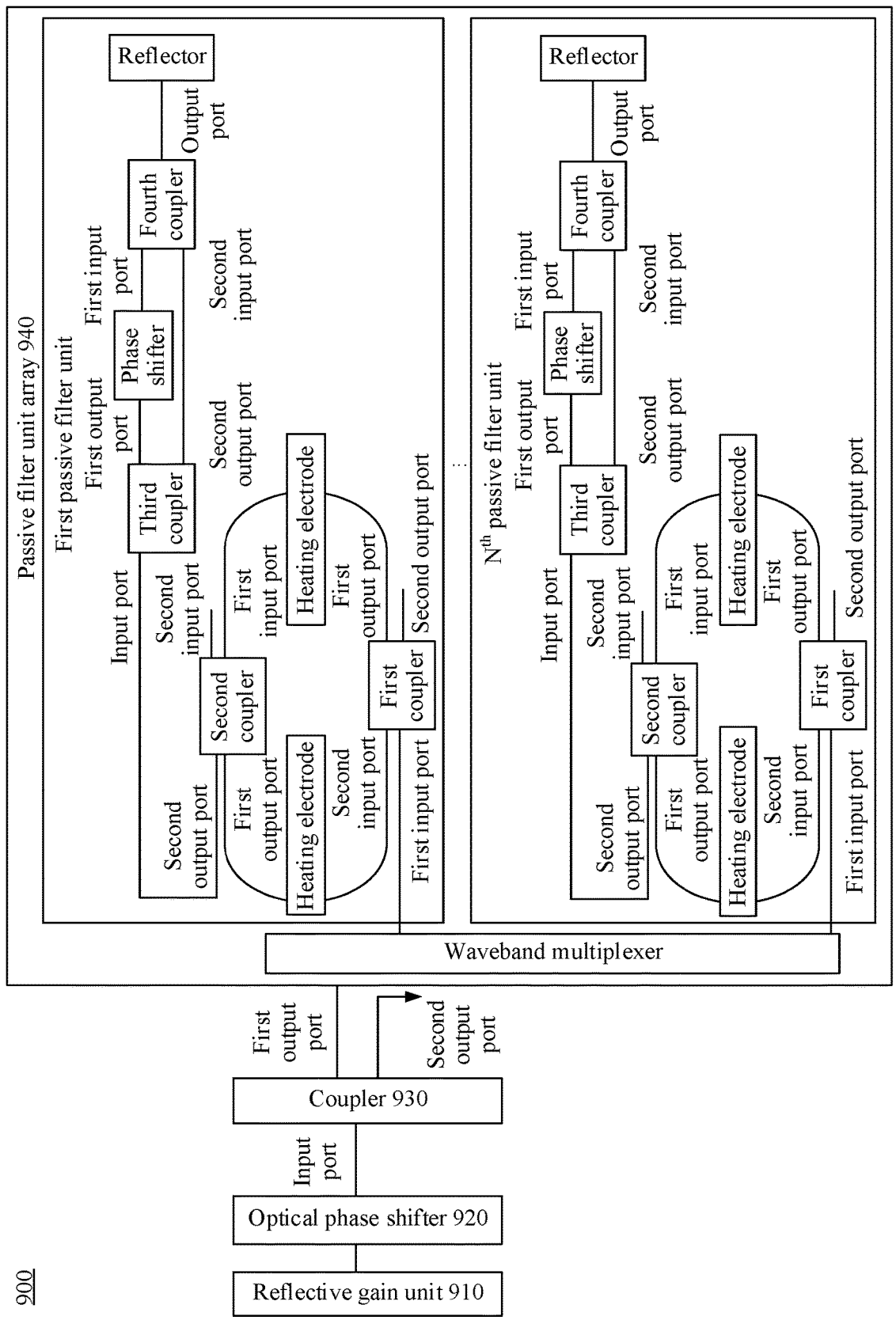
FIG. 10 is a schematic block diagram of a wavelength-tunable laser according to another embodiment of this application.

Specifically, FIG. 10 is a schematic block diagram of a wavelength-tunable laser 900 according to another embodiment of this application. The laser 900 includes a reflective gain unit 910, an optical phase shifter 920, a coupler 930, and a passive filter unit array 940.

It should be noted that, for understanding of the reflective gain unit 910, the optical phase shifter 920, and the coupler 930, refer to the reflective gain unit 110, the optical phase shifter 120, and the coupler 130 in FIG. 1. To avoid repetition, details are not described herein again.

For a specific connection manner between a waveband multiplexer of the passive filter unit array 940 and a plurality of tunable filters included in the passive filter unit array 940, refer to a corresponding connection manner in the laser 700. Details are not described herein again.

The passive filter unit array 940 includes a plurality of passive filter units, and each passive filter unit includes a microring resonator, an MZI, and a reflector. The microring resonator is configured to select light of a fixed wavelength, and the MZI determines whether light enters a current passive filter unit. The following describes in detail a connection structure of the first passive filter unit.

A first input port of a first coupler of the first passive filter unit is connected to a first output port of the waveband multiplexer, a first output port of the first coupler is connected to a first input port of a second coupler of the first passive filter unit, a first output port of the second coupler is connected to a second input port of the first coupler, and the first coupler and the second coupler form the microring resonator; a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator. A second output port of the second coupler is connected to an input port of an optical switch of the first passive filter unit, the second output port of the second coupler is connected to an input port of a third coupler of the first passive filter unit, a first output port of the third coupler is connected to a first input port of a fourth coupler of the first passive filter unit, and a second output port of the third coupler is connected to a second input port of the fourth coupler; a phase shifter covers an optical waveguide that connects the first output port of the third coupler and the first input port of the fourth coupler, and the first output port of the fourth coupler is connected to a reflector of the first passive filter unit.

A connection structure of the $N^{th}$ passive filter unit is the same as a connection structure of the first passive filter unit, and may be understood with reference to the connection structure of the first passive filter unit.

It should be understood that, that each microring resonator includes two 2×2 couplers is merely an implementable manner, and each passive filter unit may further include another quantity of couplers, configured to form a microring resonator. This is not limited in this application.

It should be further understood that a phase shifter covers any one or two optical waveguides in the MZI, and a heating electrode covers any one optical waveguide of the microring resonator.

Optionally, when the optical switch is the Mach Zehnder interferometer (MZI), and a difference between phases of two arms of the MZI is one π phase, the MZI is turned off.

It should be understood that, when the difference between the phases of the two arms of the MZI is one π phase, the MZI is completely off. When the difference between the phases of the two arms of the MZI is not one π phase, the MZI is in an on state. When the two arms of the MZI have a same phase, the MZI is completely on.

Optionally, in another embodiment of this application, the passive filter unit array includes a waveband multiplexer, the input port of the passive filter unit array is an input port of the waveband multiplexer, and each of a plurality of output ports of the waveband multiplexer is connected to one passive filter unit; each of the plurality of passive filter units includes an optical switch, a tunable filter, and a reflector; the optical switch is configured to control whether light enters the reflector, the tunable filter is configured to sift out light whose wavelength is a filter peak of the tunable filter, and the reflector is configured to reflect the sifted light; a wavelength tuning range of the tunable filter is within a filter bandwidth range of an output port of a waveband multiplexer connected to the passive filter unit in which the tunable filter is located, and the tunable filter has one and only one filter peak within the filter bandwidth range of the output port; an $N^{th}$ output port of the plurality of output ports of the waveband multiplexer is connected to an input port of an optical switch of an $N^{th}$ passive filter unit, and $N \geq 1$; an output port of the optical switch of the $N^{th}$ passive filter unit is connected to an input port of a tunable filter of the $N^{th}$ passive filter unit; and an output port of the tunable filter of the $N^{th}$ passive filter unit is connected to an input port of a reflector of the $N^{th}$ passive filter unit.

Optionally, the tunable filter is a microring resonator, and/or the optical switch is an MZI.

Optionally, in another embodiment of this application, when the tunable filter is the microring resonator, the microring resonator includes two couplers; an input port of an optical switch of the $N^{th}$ passive filter unit is connected to the $N^{th}$ output port of the waveband multiplexer, an output port of the optical switch is connected to a first input port of a first coupler of the $N^{th}$ passive filter unit, a first output port of the first coupler is connected to a first input port of a second coupler, and a first output port of the second coupler is connected to a second input port of the first coupler; a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator; and a second output port of the second coupler is connected to the reflector of the $N^{th}$ passive filter unit, and $N \geq 1$.

Optionally, in another embodiment of this application, when the optical switch is the MZI, the MZI includes two couplers; the input port of the first coupler of the $N^{th}$ passive filter unit is connected to the $N^{th}$ output port of the waveband multiplexer; a first output port of the first coupler is connected to a first input port of a second coupler of the $N^{th}$ passive filter unit, and a second output port of the first coupler is connected to a second input port of the second coupler; a phase shifter covers an optical waveguide that connects the first output port of the first coupler and the first input port of the second coupler, and/or a phase shifter covers an optical waveguide that connects the second output port of the first coupler and the second input port of the second coupler, and the phase shifter implements switching of an optical signal between a first output port and a second output port of the second coupler by changing a difference between phases of two arms of the MZI; and an output port of the second coupler is connected to the input port of the tunable filter of the $N^{th}$ passive filter unit, the output port of the tunable filter is connected to the reflector of the $N^{th}$ passive filter unit, and N≥1.

Optionally, in another embodiment of this application, when the tunable filter is the microring resonator, and the optical switch is the MZI, the MZI includes a first coupler and a second coupler, and the microring resonator includes a third coupler and a fourth coupler; an input port of a first coupler of the $N^{th}$ passive filter unit is connected to an $N^{th}$ output port of the waveband multiplexer, a first output port of the first coupler is connected to a first input port of a second coupler of the $N^{th}$ passive filter unit, and a second output port of the first coupler is connected to a second input port of the second coupler; a phase shifter covers an optical waveguide that connects the first output port of the first coupler and the first input port of the second coupler, and/or a phase shifter covers an optical waveguide that connects the second output port of the first coupler and the second input port of the second coupler, and the phase shifter implements switching of an optical signal between a first output port and a second output port of the second coupler by changing a difference between phases of two arms of the MZI; an output port of the second coupler is connected to the first input port of the third coupler of the $N^{th}$ passive filter unit, the first output port of the third coupler is connected to a first input port of a fourth coupler of the $N^{th}$ passive filter unit, and a first output port of the fourth coupler is connected to a second input port of the third coupler; a heating electrode covers an optical waveguide that connects the first output port of the third coupler and the first input port of the fourth coupler, and/or a heating electrode covers an optical waveguide that connects the first output port of the fourth coupler and the second input port of the third coupler, and the heating electrode is configured to change a filter center wavelength of the microring resonator; and a second output port of the fourth coupler is connected to the reflector of the $N^{th}$ passive filter unit, and N≥1.

Optionally, in another embodiment of this application, the laser further includes a controller, and the controller is configured to control an optical switch of each of the plurality of passive filter units to be turned on or turned off, so that at a same moment, only one of the plurality of passive filter units performs filtering.

It should be understood that, in this application, the heating electrode may alternatively be replaced with a phase shifter. For example, an optical waveguide covered with a heating electrode in the figure may alternatively be connected to a phase shifter.

It should be understood that, in this application, a name of each port of a coupler is merely an example. For example, ports of a 2×2 coupler are a first input port, a second input port, a first output port, and a second output port. The description is merely an example. Alternatively, the ports may be referred to as a first port, a second port, a third port, a fourth port, and the like. A name of a port of the coupler does not impose any limitation on this solution.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use a different method to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and units, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be another division in an actual implementation. For example, a plurality of units or components may be combined or integrated into another system, or some features may be ignored or not performed. In addition, the displayed or discussed mutual couplings, direct couplings, or communication connections may be implemented by using some interfaces. The indirect couplings or the communication connections between apparatuses or units may be implemented in electronic, mechanical, or other forms.

The units described as separate parts may or may not be physically separate, and parts displayed as units may or may not be physical units, that is, may be located in one position, or may be distributed on a plurality of network units. Some or all of the units may be selected based on actual requirements to achieve the objectives of the solutions in the embodiments.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A wavelength-tunable laser, comprising:
   a reflective gain unit;
   an optical phase shifter;
   a coupler; and
   a passive filter unit array, wherein:
      an output port of the reflective gain unit is connected to an input port of the optical phase shifter, and the reflective gain unit is configured to reflect light in a resonant cavity of the laser and provide a gain of the laser,
      an output port of the optical phase shifter is connected to an input port of the coupler, and the optical phase shifter is configured to adjust a cavity length of the resonant cavity of the laser, so that a cavity mode of the laser matches a center wavelength of a passive filter unit, a first output port of the coupler is connected to an input port of the passive filter unit array, to input, to the passive filter unit array, light to be filtered, and a second output port of the coupler is an output port of the laser, and the passive filter unit array comprises a plurality of passive filter units, wavelength tuning ranges of any two of the plurality of passive filter units are different, and only one of the plurality of passive filter units performs filtering at a of time.

2. The laser according to claim 1, wherein the passive filter unit comprises a band-pass reflector, a tunable filter, and an optical switch, and the optical switch is configured to control whether light enters the tunable filter of the passive filter unit in which the optical switch is located, the tunable filter is configured to sift out light whose wavelength is a filter peak of the tunable filter, and the band-pass reflector is configured to reflect the sifted light;

a wavelength tuning range of the tunable filter is within a bandwidth range of a reflection wavelength of the band-pass reflector, and within the bandwidth range of the reflection wavelength of the band-pass reflector, the tunable filter has only one filter peak;

the input port of the passive filter unit array is an input port of an optical switch of a first passive filter unit in the passive filter unit array;

a first output port of an optical switch of an $N^{th}$ passive filter unit is connected to an input port of a tunable filter of the $N^{th}$ passive filter unit, and an output port of the tunable filter of the $N^{th}$ passive filter unit is connected to an input port of a band-pass reflector of the $N^{th}$ passive filter unit; and a second output port of the optical switch of the $N^{th}$ passive filter unit is connected to an input port of an optical switch of an $(N+1)^{th}$ passive filter unit, and N is an integer with $N \geq 1$.

3. The laser according to claim 2, wherein the laser further comprises a controller, and the controller is configured to control an optical switch of each of the plurality of passive filter units to be turned on or turned off, so that at a same moment, only one of the plurality of passive filter units performs filtering, and the controller is further configured to control a filter wavelength of the tunable filter.

4. The laser according to claim 2, wherein the tunable filter comprises a microring resonator, and/or the optical switch is a Mach Zehnder interferometer (MZI).

5. The laser according to claim 4, wherein when the tunable filter comprises the microring resonator, and the optical switch comprises the MZI, the microring resonator comprises a first coupler, a second coupler, and a third coupler, and the MZI comprises the first coupler and the second coupler;

the input port of the passive filter unit array is a first input port of a first coupler of the first passive filter unit in the passive filter unit array;

a first output port of a first coupler of the $N^{th}$ passive filter unit is connected to a first input port of a second coupler of the $N^{th}$ passive filter unit, a first output port of the second coupler is connected to a first input port of a third coupler of the $N^{th}$ passive filter unit, and a first output port of the third coupler is connected to a second input port of the first coupler;

a heating electrode covers an optical waveguide that connects the first output port of the second coupler and the first input port of the third coupler, and/or a heating electrode covers an optical waveguide that connects the first output port of the third coupler and the second input port of the first coupler, and the heating electrode is configured to change a filter center wavelength of the microring resonator;

a second output port of the first coupler is connected to a second input port of the second coupler, and a second output port of the second coupler is connected to a first input port of a first coupler of an $(N+1)^{th}$ passive filter unit; and a second output port of the third coupler is connected to the input port of the band-pass reflector of the $N^{th}$ passive filter unit.

6. The laser according to claim 5, wherein a free spectral region of the microring resonator is equal to a free spectral region of the MZI.

7. The laser according to claim 5, wherein when a difference between phases of two arms of the MZI is one $\pi$ phase, light enters the first input port of the first coupler of the $(N+1)^{th}$ passive filter unit from the second output port of the second coupler; or when two arms of the MZI have a same phase, light enters the first input port of the third coupler from the first output port of the second coupler.

8. The laser according to claim 5, wherein a phase shifter covers an optical waveguide that connects the first output port of the first coupler and the first input port of the second coupler, and/or a phase shifter covers an optical waveguide that connects the second output port of the first coupler and the second input port of the second coupler; and the phase shifter implements switching of an optical signal between a first output port and a second output port of the second coupler by changing a difference between phases of two arms of the MZI.

9. The laser according to claim 4, wherein when the optical switch comprises the MZI, the MZI comprises two couplers;

the input port of the passive filter unit array is a first input port of a first coupler of the first passive filter unit in the passive filter unit array;

a first output port of a first coupler of the $N^{th}$ passive filter unit is connected to a first input port of a second coupler of the $N^{th}$ passive filter unit, a second output port of the first coupler is connected to a second input port of the second coupler, a first output port of the second coupler is connected to the input port of the tunable filter of the $N^{th}$ passive filter unit, and a second output port of the second coupler is connected to an input port of a first coupler of the $(N+1)^{th}$ passive filter unit; and an output port of a tunable filter of the $N^{th}$ passive filter unit is connected to an input port of a band-pass reflector of the $N^{th}$ passive filter unit.

10. The laser according to claim 4, wherein when the tunable filter comprises the microring resonator, the microring resonator comprises two couplers;

the input port of the passive filter unit array is the input port of the optical switch of the first passive filter unit in the passive filter unit array;

the first output port of the optical switch of the $N^{th}$ passive filter unit is connected to a first input port of a first coupler of the $N^{th}$ passive filter unit, a first output port of the first coupler is connected to a first input port of a second coupler of the $N^{th}$ passive filter unit, and a first output port of the second coupler is connected to a second input port of the first coupler; and a second output port of the second coupler is connected to the input port of the band-pass reflector of the $N^{th}$ passive filter unit, and the second output port of the optical switch of the $N^{th}$ passive filter unit is connected to the input port of the optical switch of the $(N+1)^{th}$ passive filter unit.

11. The laser according to claim 10, wherein a heating electrode covers an optical waveguide that connects the first output port of the first coupler and the first input port of the second coupler, and/or a heating electrode covers an optical waveguide that connects the first output port of the second coupler and the second input port of the first coupler, and the heating electrode is configured to change a filter center wavelength of the microring resonator.

12. The laser according to claim 1, wherein the passive filter unit array comprises a waveband multiplexer, the input port of the passive filter unit array is an input port of the waveband multiplexer, and one of a plurality of output ports of the waveband multiplexer is connected to one passive filter unit;
  each of the plurality of passive filter units comprises a tunable filter, an optical switch, and a reflector;
  the optical switch is configured to control whether light enters the reflector, the tunable filter is configured to sift out light whose wavelength is a filter peak of the tunable filter, and the reflector is configured to reflect the sifted light;
  a wavelength tuning range of the tunable filter is within a filter bandwidth range of an output port of a waveband multiplexer connected to the passive filter unit in which the tunable filter is located, and the tunable filter has only one filter peak within the filter bandwidth range of the output port;
  an $N^{th}$ output port of the plurality of output ports of the waveband multiplexer is connected to an input port of a tunable filter of an $N^{th}$ passive filter unit, and N is an integer with N≥1;
  an output port of the tunable filter of the $N^{th}$ passive filter unit is connected to an input port of an optical switch of the $N^{th}$ passive filter unit; and
  an output port of the optical switch of the $N^{th}$ passive filter unit is connected to an input port of a reflector of the $N^{th}$ passive filter unit.

13. The laser according to claim 12, wherein the tunable filter comprises a microring resonator and/or the optical switch comprises a Mach Zehnder interferometer (MZI).

14. The laser according to claim 13, wherein when the tunable filter comprises the microring resonator, the microring resonator comprises two couplers;
  a first input port of a first coupler of the $N^{th}$ passive filter unit is connected to the $N^{th}$ output port of the waveband multiplexer, a first output port of the first coupler is connected to a first input port of a second coupler of the $N^{th}$ passive filter unit, and a first output port of the second coupler is connected to a second input port of the first coupler; and
  a second output port of the second coupler is connected to the input port of the optical switch of the $N^{th}$ passive filter unit, and the output port of the optical switch of the $N^{th}$ passive filter unit is connected to the reflector of the $N^{th}$ passive filter unit.

15. The laser according to claim 13, wherein when the optical switch comprises the MZI, the MZI comprises two couplers;
  the input port of the tunable filter of the $N^{th}$ passive filter unit is connected to the $N^{th}$ output port of the waveband multiplexer;
  the output port of the tunable filter is connected to an input port of a first coupler of the $N^{th}$ passive filter unit;
  a first output port of the first coupler is connected to a first input port of a second coupler of the $N^{th}$ passive filter unit, and a second output port of the first coupler is connected to a second input port of the second coupler; and
  an output port of the second coupler is connected to the reflector of the $N^{th}$ passive filter unit.

16. The laser according to claim 13, wherein when the tunable filter comprises the microring resonator, and the optical switch comprises the MZI, the microring resonator comprises a first coupler and a second coupler, and the MZI comprises a third coupler and a fourth coupler;
  a first input port of a first coupler of the $N^{th}$ passive filter unit is connected to the $N^{th}$ output port of the waveband multiplexer, a first output port of the first coupler is connected to a first input port of a second coupler of the $N^{th}$ passive filter unit, and a first output port of the second coupler is connected to a second input port of the first coupler; and
  a second output port of the second coupler is connected to an input port of a third coupler of the $N^{th}$ passive filter unit, a first output port of the third coupler is connected to a first input port of a fourth coupler of the $N^{th}$ passive filter unit, and a second output port of the third coupler is connected to a second input port of the fourth coupler;
  a phase shifter covers an optical waveguide that connects the first output port of the third coupler and the first input port of the fourth coupler, and/or a phase shifter covers an optical waveguide that connects the second output port of the third coupler and the second input port of the fourth coupler, and the phase shifter implements switching of an optical signal between a first output port and a second output port of the fourth coupler by changing a difference between phases of two arms of the MZI; and
  the first output port of the fourth coupler is connected to the reflector of the $N^{th}$ passive filter unit.

17. The laser according to claim 1, wherein the passive filter unit array comprises a waveband multiplexer, the input port of the passive filter unit array is an input port of the waveband multiplexer, and one of a plurality of output ports of the waveband multiplexer is connected to one passive filter unit;
  each of the plurality of passive filter units comprises an optical switch, a tunable filter, and a reflector;
  the optical switch is configured to control whether light enters the reflector, the tunable filter is configured to sift out light whose wavelength is a filter peak of the tunable filter, and the reflector is configured to reflect the sifted light;
  a wavelength tuning range of the tunable filter is within a filter bandwidth range of an output port of a waveband multiplexer connected to the passive filter unit in which the tunable filter is located, and the tunable filter has only one filter peak within the filter bandwidth range of the output port;
  an $N^{th}$ output port of the plurality of output ports of the waveband multiplexer is connected to an input port of an optical switch of an $N^{th}$ passive filter unit, and N is an integer with N≥1;
  an output port of the optical switch of the $N^{th}$ passive filter unit is connected to an input port of a tunable filter of the $N^{th}$ passive filter unit; and
  an output port of the tunable filter of the $N^{th}$ passive filter unit is connected to an input port of a reflector of the $N^{th}$ passive filter unit.

18. The laser according to claim 17, wherein the tunable filter comprises a microring resonator and/or the optical switch comprises a Mach Zehnder interferometer (MZI).

* * * * *